United States Patent
Lim et al.

(10) Patent No.: US 9,712,773 B2
(45) Date of Patent: Jul. 18, 2017

(54) IMAGE SENSOR AND STACKED STRUCTURE THEREOF

(71) Applicant: Samsung Electronics Co., Ltd., Suwon-si (KR)

(72) Inventors: Sin-hwan Lim, Hwaseong-si (KR); Jung-ho Lee, Gunpo-si (KR); Hae-sick Sul, Hwaseong-si (KR); Jae-cheol Yun, Seoul (KR); Michael Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 114 days.

(21) Appl. No.: 14/615,679

(22) Filed: Feb. 6, 2015

(65) Prior Publication Data

US 2015/0334326 A1 Nov. 19, 2015

(30) Foreign Application Priority Data

May 13, 2014 (KR) ........................ 10-2014-0057444

(51) Int. Cl.
*H04N 5/378* (2011.01)
*H01L 27/146* (2006.01)

(52) U.S. Cl.
CPC ....... *H04N 5/378* (2013.01); *H01L 27/14636* (2013.01)

(58) Field of Classification Search
CPC .......................... H04N 5/378; H01L 27/14636
See application file for complete search history.

(56) References Cited

U.S. PATENT DOCUMENTS

| 6,734,905 | B2 | 5/2004 | Fossum et al. |
| 7,518,645 | B2 | 4/2009 | Farrier |
| 7,616,231 | B2 | 11/2009 | Farrier |
| 7,667,176 | B2 | 2/2010 | Olsen et al. |
| 7,781,716 | B2 | 8/2010 | Anderson et al. |
| 8,023,020 | B2 | 9/2011 | Moini et al. |
| 8,350,622 | B2 | 1/2013 | Kumar et al. |
| 8,416,468 | B2 | 4/2013 | Underwood et al. |
| 8,456,557 | B2 | 6/2013 | Wang et al. |
| 8,462,242 | B2 | 6/2013 | Hiyama et al. |
| 8,525,906 | B2 | 9/2013 | Ui |
| 8,625,014 | B2 | 1/2014 | Yoo et al. |
| 8,890,047 | B2 * | 11/2014 | Solhusvik ......... H01L 27/14634 250/208.1 |
| 2008/0011958 | A1 * | 1/2008 | Endo .................... A61B 6/4488 250/370.08 |
| 2011/0156197 | A1 | 6/2011 | Tivarus et al. |
| 2013/0044248 | A1 | 2/2013 | Turner et al. |
| 2013/0068929 | A1 | 3/2013 | Solhusvik et al. |

OTHER PUBLICATIONS

Kimura, Sony Unveils Lamindated CMOS Sensor Using TSVS, http://techon.nikkeipb.co.jp/english/NEWS EN/20130222/237487 (printed Sep. 30, 2013).

* cited by examiner

*Primary Examiner* — Tony Ko
(74) *Attorney, Agent, or Firm* — Onello & Mello, LLP.

(57) ABSTRACT

There are provided an image sensor and a stacked structure thereof. The image sensor includes a pixel array in which a plurality of unit pixels for generating an output signal in accordance with incident light are arranged, a first amplifier having a first input dynamic range, and a second amplifier having a second input dynamic range that is larger than the first input dynamic range. One of the first and second amplifiers amplifies the output signal in accordance with the intensity of light.

17 Claims, 12 Drawing Sheets

IMAGE SENSOR AND STACKED STRUCTURE THEREOF

CROSS-REFERENCE TO RELATED APPLICATION

This application claims the benefit under 35 U.S.C §119, of Korean Patent Application No. 10-2014-0057444, filed on May 13, 2014, in the Korean Intellectual Property Office, the contents of which is incorporated herein in its entirety by reference.

FIELD OF INVENTION

The inventive concept relates to an image sensor and a stacked structure thereof, and more particularly, to an image sensor including a pixel array and a stacked structure thereof. The inventive method may further relate to a method of making, implementing, and using same, as well as methods of its operation.

BACKGROUND

Image sensors used to photograph subjects and convert the photographed images into electrical signals are used in cameras mounted on a vehicle, a security apparatus, and a robot, as well as in general consumer electronics, such as a digital camera, a mobile phone camera, and a portable camcorder. Such an image sensor may include a pixel array and unit pixels included in the pixel array may respectively include photo detecting devices. The photo detecting devices may generate electrical signals in accordance with the intensities of absorbed light. For example, among the photo detecting devices, photodiodes may absorb the light to generate currents.

An image sensor may include transistors for controlling photo detecting devices, a circuit for driving a pixel array, and a circuit for measuring output signals of the pixel array as well as the photo detecting devices. The photo detecting devices, the transistors for controlling photo detecting devices, the circuit for driving a pixel array, and the circuit for measuring output signals of the pixel array may be respectively formed by semiconductor manufacturing processes. For example, the electrical signals generated by the photo detecting devices may pass through at least one transistor to be converted into output signals whose voltages change in accordance with the intensities of the absorbed light and the pixel array may output the output signals external to another circuit or device.

SUMMARY

In accordance with aspects of the inventive concept, an image sensor is provided that includes a pixel array that generates output signals in accordance with incident light and a stacked structure thereof. The image sensor may include an amplifier circuit having at least two amplifiers having different dynamic ranges.

According to an aspect of the inventive concept, there is provided an image sensor including a pixel array having a plurality of unit pixels configured to generate an output signal in response to incident light, a first amplifier having a first input dynamic range, and a second amplifier having a second input dynamic range that is larger than the first input dynamic range. One of the first and second amplifiers amplifies the output signal in accordance with the intensity of light.

In various embodiments, the image sensor may further include a reference signal generator configured to generate a reference signal. The first and second amplifiers may be differential amplifiers configured to each receive the reference signal and the output signal as inputs and to measure the output signal relative to the reference signal.

In various embodiments, the second amplifier may be a complementary metal-oxide-semiconductor (CMOS) input folded cascade amplifier.

In various embodiments, the image sensor may include stacked first and second chips. The pixel array may be arranged in the first chip. The first and second amplifiers may be arranged in the second chip.

In various embodiments, a feature size of the first chip may be larger than that of the second chip.

In various embodiments, a power supply voltage of the first chip may be higher than that of the second chip.

In various embodiments, the image sensor may further include at least one interconnecting member coupled between the first chip and the second chip to transfer the output signal between the first and second chips. The interconnecting member may be electrically connected to unit pixels corresponding to a column of the pixel array.

In various embodiments, the image sensor may further include a counter configured to convert a signal amplified by the first or second amplifier into a digital signal. The counter may be arranged in the second chip.

In various embodiments, the first and second amplifiers may be configured to receive a control signal. A power consumption of the first amplifier or the second amplifier may be stopped depending on a voltage level of the control signal.

According to another aspect of the inventive concept, there is provided an image sensor including a first chip having a pixel array comprising a plurality of unit pixels configured to generate an output signal in accordance with incident light, a second chip including first and second amplifiers with different input dynamic ranges, such that one of the first and second amplifiers amplifies the output signal depending on the intensity of the incident light, and an interconnecting member arranged to transmit the output signal from the first chip to the second chip. The first and second chips may be stacked, one at least partially on the other.

In various embodiments, the feature size of the first chip may be larger than that of the second chip. A power supply voltage of the first chip may be higher than that of the second chip.

In various embodiments, an input dynamic range of the second amplifier may be larger than that of the first amplifier. A gain of the first amplifier may be larger than that of the second amplifier.

In various embodiments, the second chip may further include a reference signal generator configured to generate a reference signal used to measure the output signal. The first and second amplifiers may be differential amplifiers that receive the reference signal and the output signal as inputs.

In various embodiments, the first and second amplifiers may receive a control signal. Power consumption of one of the first and second amplifiers may be stopped in accordance with the control signal.

In various embodiments, the interconnecting member may be electrically connected to unit pixels corresponding to a column of the pixel array.

In accordance with another aspect of the inventive concept, provided is an image sensor, comprising a pixel array comprising a plurality of unit pixels configured to generate a plurality of output signals is response to incident light; and a plurality of amplifier circuits configured to receive the plurality of output signals. Each amplifier circuit comprises a first amplifier having a first input dynamic range and configured to amplify the output signal when the incident light has a low intensity and a second amplifier having a second input dynamic range that is larger than the first input dynamic range, and configured to amplify the output signal when the incident light has a high intensity.

In various embodiments, the first amplifier may have a larger gain than the second amplifier.

In various embodiments, the first and second amplifiers may be configured to receive a control signal and a power consumption of the first amplifier or the second amplifier may be stopped depending on a voltage level of the control signal.

In various embodiments, the pixel array may be formed on a first chip and the plurality of amplifiers may be formed on at least one second chip.

In various embodiments, the image sensor may further comprise an interconnecting member arranged to transmit the output signal from the first chip to the at least one second chip, wherein the first chip and the at least one second chip are stacked.

BRIEF DESCRIPTION OF THE DRAWINGS

Exemplary embodiments of one or more new and useful process, machine, manufacture, and/or improvement thereof, in accordance with the inventive concept, are provided in the following detailed description taken in conjunction with the accompanying drawings, in which.

DETAILED DESCRIPTION OF THE EMBODIMENTS

Figure 1:
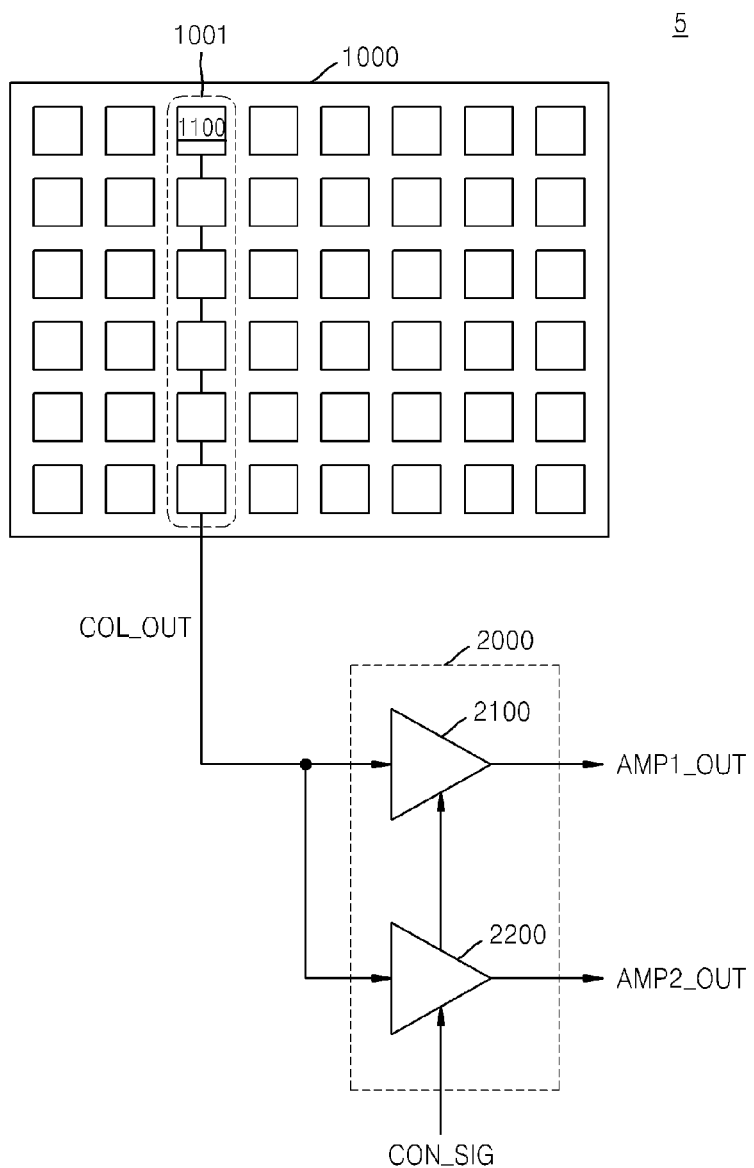
FIG. 1 is a schematic view illustrating an embodiment of an image sensor, according to aspects of the inventive concept.

Aspects of the inventive concept will now be described more fully with reference to the accompanying drawings, in which exemplary embodiments are shown. The inventive concept may, however, be embodied in many different forms and should not be construed as limited to the exemplary embodiments set forth herein.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

To the extent that functional features, operations, and/or steps are described herein, or otherwise understood to be included within various embodiments of the inventive concept, such functional features, operations, and/or steps can be embodied in functional blocks, units, modules, operations and/or methods. And to the extent that such functional blocks, units, modules, operations and/or methods include computer program code, such computer program code can be stored in a computer readable medium, e.g., such as non-transitory memory and media, that is executable by at least one computer processor.

FIG. 1 is a schematic view illustrating an embodiment of an image sensor 5 according to aspects of the inventive concept. As illustrated in FIG. 1, the image sensor 5 may include a pixel array 1000 and one or more amplifier circuits 2000. The pixel array 1000 may include unit pixels 1100 arranged in one or more columns, such as column 1001. A column may generate output signals COL_OUT respectively generated by the unit pixels 1100 of the column, in response to received or incident light from the outside. Other columns of pixels may also output respective COL_OUT output signals, to a respective amplifier circuit. That is, the amplifier circuits 2000 may receive the output signals COL_OUT from the pixel array 1000 and may amplify the received output signals COL_OUT.

According to this embodiment, the unit pixels 1100 included in one column of the pixel array 1000 may share a line used to output the signals COL_OUT to the outside of or external to the pixel array 1000. For example, as illustrated in FIG. 1, a column 1001 of the pixel array 1000 may include six unit pixels and the six unit pixels may share the line used to transmit the output signals COL_OUT respectively generated by the six unit pixels. In this manner, output signals from all pixel unit light-absorbing components in a column are output to the outside of the pixel array 1000 using a shared line. The pixel array 1000 may sequentially select six unit pixels that share one line (that is, six unit pixels included in one column) and the six unit pixels may respectively output the output signals COL_OUT to the outside of the pixel array 1000 with a time difference. Aspects of the unit pixel 1100 will be described in detail with reference to FIG. 2.

According to this embodiment, each of the amplifier circuits 2000 may include a first amplifier 2100 and a second amplifier 2200. The first amplifier 2100 may amplify an output signal COL_OUT to output a first amplified signal AMP1_OUT, and the second amplifier 2200 may amplify an output signal COL_OUT to output a second amplified signal AMP2_OUT. The first amplified signal AMP1_OUT or the second amplified signal AMP2_OUT may be transmitted to an analog-to-digital converter (ADC) or a digital counter and be converted into digital data. In addition, the image sensor 5 may include a plurality of amplifier circuits 2000 corresponding to a plurality of columns of pixels of the pixel array 1000. For example, there could be one amplifier circuit for each pixel column. The amplifier circuits 2000 may respectively receive output signals COL_OUT from the columns of the pixel array 1000.

Additionally, the first and second amplifiers 2100 and 2200 may be respectively turned on or off in accordance with a control signal CON_SIG. For example, one of the first and second amplifiers 2100 and 2200 may stop operating (or consuming power) in accordance with the control signal CON_SIG and the other of the first and second amplifiers 2100 and 2200 may operate normally (that is, amplify the output signal COL_OUT). The control signal CON_SIG may be a signal input to the first and second amplifiers 2100 and 2200 through at least one line, wherein a voltage level of the control signal CON_SIG may cause one of the first and second amplifiers to turn off while the other operates.

A range of the intensity of light that may be sensed by the image sensor 5 is referred to as a dynamic range of the image sensor 5. If the image sensor 5 has a large dynamic range, the image sensor 5 may sense an image ranging from a dark image to a bright image. The output signal COL_OUT generated by the unit pixels 1100 from incident light with low intensity and output to the outside of the pixel array 1000 may have a small value (or change amount), and the output signal COL_OUT generated by the unit pixels 1100 in accordance with light with high intensity and output to the outside of the pixel array 1000 may have a large value (or change amount). For example, the output signal COL_OUT may be an electrical signal having a voltage that changes in accordance with the intensity of received light and may have a voltage that increases (or is reduced) as the intensity of the light increases.

In order for the image sensor 5 having a large dynamic range to sense a dark image, the output signal COL_OUT corresponding to light with low intensity may be amplified with a large gain. In addition, in order for the image sensor 5 having a large dynamic range to sense a bright image, the output signal COL_OUT corresponding to light with high intensity may have a large value. According to an embodiment, the amplifier circuit 2000 may normally amplify the output signal COL_OUT having a large value, which may have a larger gain than that of the output signal COL_OUT having a small value.

According to an embodiment, the first amplifier 2100 may have a first input dynamic range and the second amplifier 2200 may have a second input dynamic range that is larger than the first input dynamic range. An input dynamic range refers to a voltage range of an input signal that an amplifier (for example, the first or second amplifier 2100 or 2200) may normally amplify. Therefore, the second amplifier 2200 may have an input signal range (that is, a range of the output signal COL_OUT that may be normally amplified) that is larger than that of the first amplifier 2100. In addition, according to an embodiment, a gain of the first amplifier 2100 may be larger than that of the second amplifier 2200. Therefore, the first amplifier 2100 may amplify the output signal COL_OUT with a larger gain than that of the second amplifier 2200.

According to an embodiment, the first amplifier 2100 may amplify the output signal COL_OUT corresponding to the light with low intensity and the second amplifier 2200 may amplify the output signal COL_OUT corresponding to the light with high intensity. That is, the first amplifier 2100 and the second amplifier 2200 may be turned on or off in accordance with the control signal CON_SIG, which may be controlled in accordance with the intensity of light incident on the pixel array 1000. For example, the control signal CON_SIG may selectively block a current path from a power supply voltage of the first or second amplifier 2100 or 2200 to a ground voltage to turn on or off the first or second amplifier 2100 or 2200.

In this embodiment, the first amplifier 2100 may have a gain larger than that of the second amplifier 2200. For example, the first amplifier 2100 may have a gain of x3 to x6, while the second amplifier 2200 may have a gain of x1 to x3. The first amplifier 2100 may generate a first amplified signal AMP1_OUT by amplifying the output signal COL_OUT having a relatively small intensity value, which is generated by the unit pixels 1100 of the pixel array 1000 absorbing the light with low intensity. Therefore, the image sensor 5 may measure the intensity of the light with low intensity from the first amplified signal AMP1_OUT, amplified to have a larger value, to improve the resolution of the light with low intensity.

In addition, the second amplifier 2200 has the second input dynamic range that is larger than the first input dynamic range of the first amplifier 2100. The second amplifier 2200 may normally amplify the output signal COL_OUT having a relatively large intensity value, which is generated by the unit pixels 1100 of the pixel array 1000 absorbing the light with high intensity, to generate the second amplified signal AMP2_OUT. Therefore, the image sensor 5 measures the intensity of the light with high intensity through the normally amplified second amplified signal AMP2_OUT to improve the resolution of the light with high intensity.

Figure 9:
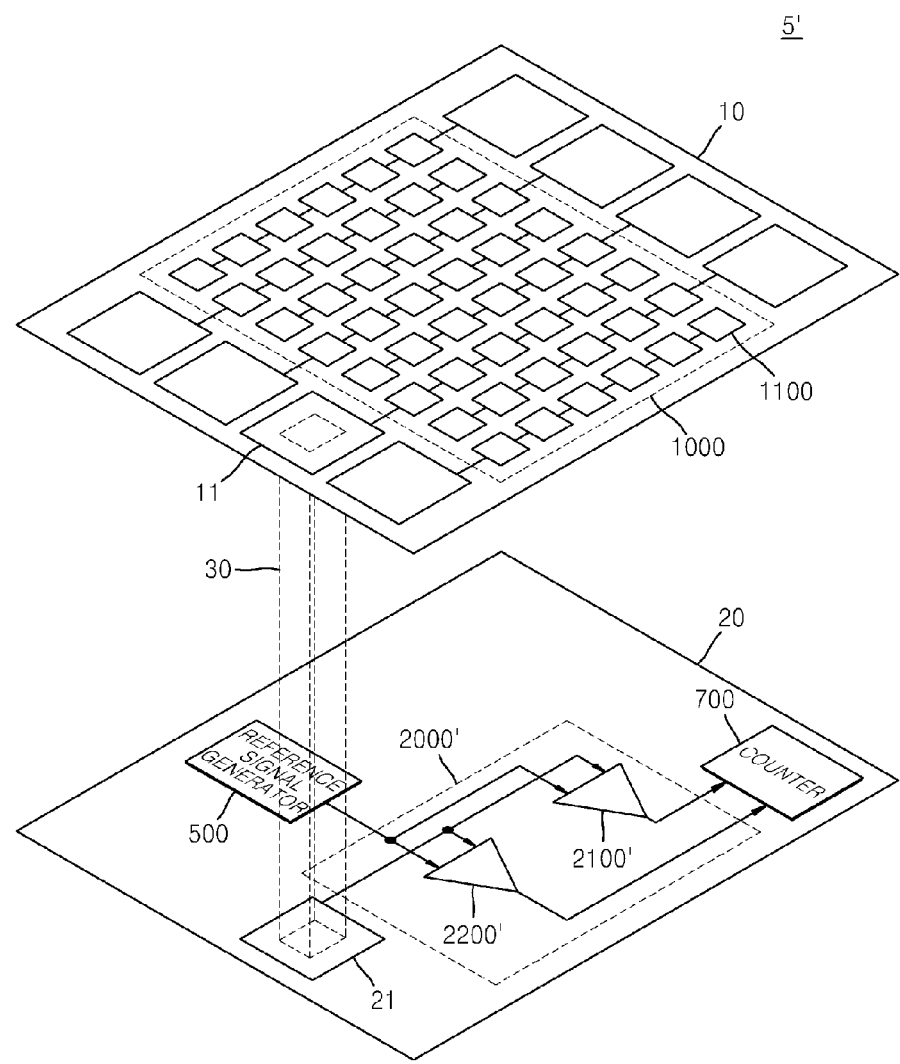
FIG. 9 is a view illustrating an embodiment of a structure of an image sensor, according to aspects of the inventive concept.

As illustrated in the embodiment of FIG. 9, in a stacked image sensor 5', unit pixels 1100 of a pixel array 1000 may receive a power supply voltage that is higher than that supplied to an amplifier circuit 2000'. Therefore, a range of an output signal COL_OUT output by the pixel array 1000 may be large. In particular, the amplifier circuit 2000' needs to normally amplify the output signal COL_OUT, such amplification corresponding to light with high intensity. Since the second amplifier 2200' has the large second input dynamic range, the output signal COL_OUT corresponding to the light with high intensity may be normally amplified.

On the other hand, a line at which the first amplifier 2100' outputs the first amplified signal AMP1_OUT and a line at which the second amplifier 2200' outputs the second amplified signal AMP2_OUT may be electrically connected. For example, when the first amplifier 2100' is turned off and the second amplifier 2200' is turned on, in accordance with the control signal CON_SIG, the line at which the first amplifier 2100' outputs the first amplified signal AMP1_OUT may be in a high impedance state. Therefore, the second amplified signal AMP2_OUT of the second amplifier 2200' may be normally output without being affected by the first amplifier 2100'.

Figure 2:
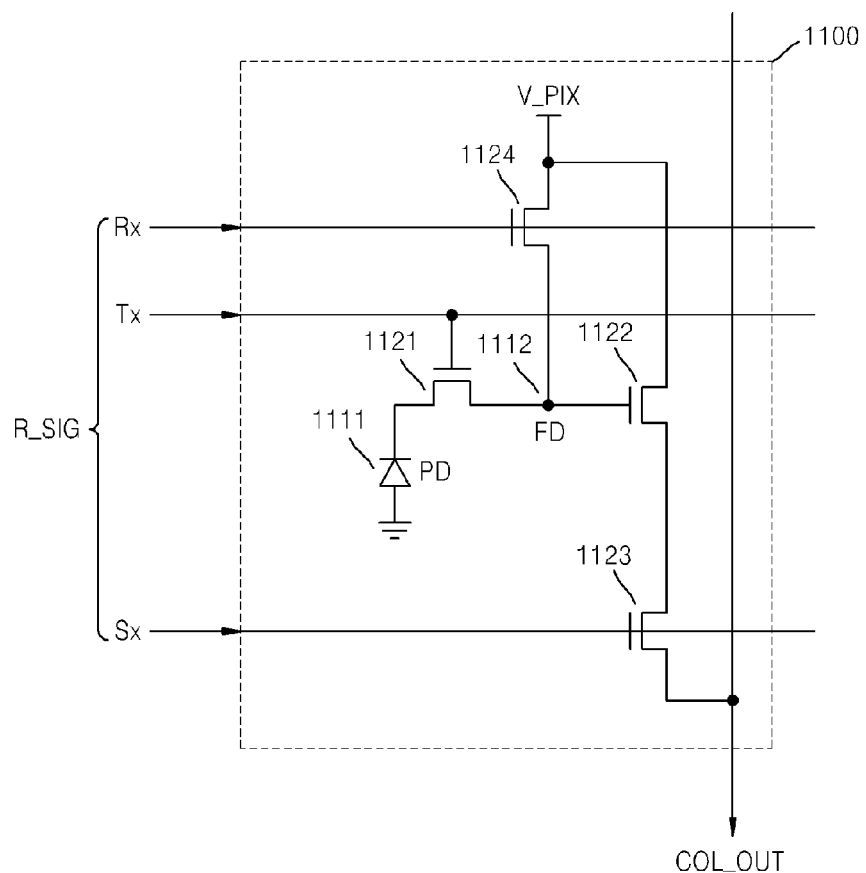
FIG. 2 is a circuit diagram of an embodiment of a unit pixel, according to aspects of the inventive concept.

FIG. 2 is an embodiment of a circuit diagram of a unit pixel 1100 according to an aspect of the inventive concept. The unit pixel 1100 may generate an electrical signal corresponding to the incident light it receives and may output the generated electrical signal externally, outside of the unit pixel 1100 and through column 1001. The unit pixel 1100 illustrated in FIG. 2 is only an example, the inventive concept may be applied to different unit pixels that are from the unit pixel 1100 embodiment illustrated in FIG. 2.

Referring to FIG. 2, the unit pixel 1100 according to this embodiment may receive a power supply voltage V_PIX and a row signal R_SIG and may output the output signal COL_OUT. The image sensor 5 may include a row driver (not shown) that outputs the row signal R_SIG, and the unit pixels 1100 included in one row in the pixel array 1000 may receive the same row signal R_SIG. The unit pixels 1100 included in one column, such as column 1001 of FIG. 1, may share a line at which the output signals COL_OUT are respectively output by unit pixels 1100. Therefore, in response to the row signal R_SIG, the output signals COL_OUT respectively corresponding to the unit pixels 1100 included in one row may be simultaneously output to the outside of the pixel array 1000 and transmitted to the amplifier circuits 2000. In order to control a plurality of transistors included in the unit pixel 1100, the row signal R_SIG may be applied to gates of the transistors. The row signal R_SIG may include a reset signal Rx, a transmission signal Tx, and a selection signal Sx. A voltage of the output signal COL_OUT may be determined in accordance with the intensity of light sensed by the unit pixel 1100.

As illustrated in FIG. 2, the unit pixel 1100 may include a photo detecting device 1111, a transmission transistor 1121, a source-follower transistor 1122, a selection transistor 1123, and a reset transistor 1124. In addition, the unit pixel 1100 may include a floating diffusion node 1112 to which the transmission transistor 1121, the source-follower transistor 1122, and the reset transistor 1124 are electrically connected. The photo detecting device 1111 absorbs light and responsively generates an electrical signal in accordance with the intensity of the light, and may be, for example, a photodiode, a photogate, or a phototransistor. FIG. 2 illustrates an example embodiment in which the photo detecting device 1111 is a photodiode. However, the inventive concept is not limited thereto.

The transmission transistor 1121 may transmit charges accumulated by the photo detecting device 1111 to the floating diffusion node 1112 or may block the charges in accordance with the transmission signal Tx. For example, while the photo detecting device 1111 absorbs the light to accumulate charges, the transmission signal Tx having a voltage that may turn off the transmission transistor 1121 may be applied to the gate of the transmission transistor 1121. In addition, when the light is blocked so that the photo detecting device 1111 stops absorbing the light, the transmission signal Tx having a voltage that may turn on the transmission transistor 1121 may be applied to the gate of the transmission transistor 1121.

The source-follower transistor 1122 may amplify a voltage of the floating diffusion node 1112, and the selection transistor 1123 may selectively output the amplified voltage in accordance with the selection signal Sx. The reset transistor 1124 may also apply a pixel voltage V_PIX to the floating diffusion node 1112 or may stop the pixel voltage V_PIX from being applied to the floating diffusion node 1112 in accordance with the reset signal Rx. When the reset transistor 1124 applies a pixel voltage V_PIX to the floating diffusion node 1112, the voltage of the floating diffusion node 1112 may be a reset voltage that is close to the pixel voltage V_PIX. The pixel voltage V_PIX may be a voltage that is high enough to reset the floating diffusion node 1112.

Before the voltage of the photo detecting device 1111 is transmitted to the floating diffusion node 1112, the floating diffusion node 1112 may be reset by the turned on reset transistor 1124. The reset voltage of the floating diffusion node 1112 may be amplified by the source-follower transistor 1122 and may be output external to the unit pixel 1100 when the selection transistor 1123 is turned on. When the reset voltage of the floating diffusion node 1112 is completely output, the reset transistor 1124 is turned off and the transmission transistor 1121 is turned on so that a voltage in accordance with the charges accumulated by the photo detecting device 1111 may be transmitted to the floating diffusion node 1112. Like the reset voltage of the floating diffusion node 1112, the changed voltage of the floating diffusion node 1112 may be output external to the unit pixel 1100 through the source-follower transistor 1122 and the selection transistor 1123.

The image sensor 5 may measure the intensity of the light absorbed by the photo detecting device 1111 through a voltage difference between the reset voltage of the floating diffusion node 1112 and the voltage generated by the photo detecting device 1111. Such an operation is referred to as correlated double sampling (CDS). An order in which the unit pixel 1100 outputs the reset voltage and the voltage generated by the photo detecting device 1111 may vary. The image sensor 5 may compensate for deviations among the unit pixels 1100 included in the pixel array 1000 through CDS.

The unit pixel 1100, including an element for amplifying the electrical signal obtained by the photo detecting device 1111 absorbing the light and converting the absorbed light, can be referred to as an active pixel sensor (APS). FIG. 2 illustrates an embodiment where the unit pixel 1100 includes n-channel metal-oxide-semiconductor field-effect transistor (NMOS) transistors, which is only an example. The unit pixel 1100 may include p-channel metal-oxide-semiconductor field-effect transistor (PMOS) transistors, in other embodiments, as other examples. The unit pixel 1100 according to aspects of the inventive concept may be applied to an APS of another structure including the photo detecting device 1111, as well as the APS of the structure illustrated in FIG. 2.

Figure 3:
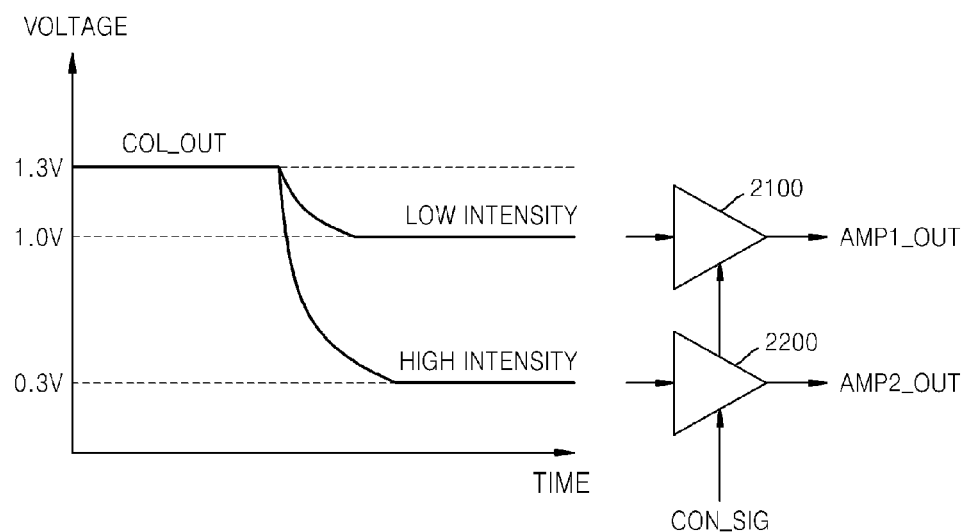
FIG. 3 is a view illustrating an embodiment of an operation of the unit pixel, according to aspects of the inventive concept.

FIG. 3 is a view illustrating an embodiment of an operation of the unit pixel 1100, according to an aspects of the inventive concept. As described with reference to FIG. 2, the output signal COL_OUT generated by the unit pixel 1100 may be a signal of which a voltage changes in accordance with the intensity of the incident light. For example, the output signal COL_OUT may be a signal of which a voltage is reduced as the intensity of the incident light increases. As illustrated in FIG. 3, the voltage of the output signal COL_OUT may be maintained as 1.3V before the voltage thereof changes in accordance with the incident light. Referring to FIGS. 2 and 3, the electrical signal generated by the light absorbed by the photo detecting device 1111 may pass through the transmission transistor 1121, the floating diffusion node 1112, the source-follower transistor 1122, and the selection transistor 1123 and the voltage of the output signal COL_OUT may be finally reduced.

As illustrated in FIG. 3, when the intensity of the light incident on the unit pixel 1100 is small (that is, when the intensity of the light absorbed by the photo detecting device 1111 is small), the voltage of the output signal COL_OUT may be reduced by 0.3V to transit to 1.0V. On the other hand, when the intensity of the light incident on the unit pixel 1100 is large (that is, when the intensity of the light absorbed by the photo detecting device 1111 is large), the voltage of the output signal COL_OUT may be reduced by 1V to transit to 0.3V.

Referring to FIGS. 1 and 3, according to an embodiment, the first amplifier 2100 may amplify the output signal COL_OUT to a value of 1.0V to correspond to the intensity of the light with low intensity with a large gain (for example, x3 to x16) to output the first amplified signal AMP1_OUT. On the other hand, the second amplifier 2200 having a large second input dynamic range may amplify the output signal COL_OUT to a value of 0.3V to correspond to the intensity of the light with high intensity to output the second amplified signal AMP2_OUT. The control signal CON_SIG may determine whether the first amplifier 2100 or the second amplifier 2200 amplifies the output signal COL_OUT.

According to various embodiments of the inventive concept, the control signal CON_SIG may be generated within the image sensor 5 and may be received by one or more components or devices outside of the image sensor 5. A photographing apparatus including the image sensor 5 may sense the brightness of a subject before photographing the subject. For example, when the photographing apparatus including the image sensor 5 is a camera, before a user of the camera presses a photographing button to photograph the subject and to generate image data, the brightness of the subject may be sensed in advance by the pixel array 1000. Therefore, the photographing apparatus (or the image sensor 5) may obtain information on the brightness of the subject in advance to generate the control signal CON_SIG in accordance with the brightness of the subject.

For example, sensing the brightness of the subject in advance, the photographing apparatus (or the image sensor 5) may compare an average value of the output signals COL_OUT output by the unit pixels 1100 included in the pixel array 1000 or a value of the output signal COL_OUT generated by a unit pixel at a specific position (for example, a position designated by the user) among the unit pixels 1100 included in the pixel array 1000 with a predetermined reference value to generate the control signal CON_SIG for selecting the first or second amplifier 2100 or 2200 when the subject is photographed. The brightness of the subject may be sensed in advance of acquiring image data by a controller included in the image sensor 5 or a processor connected to the image sensor 5.

Figure 4:
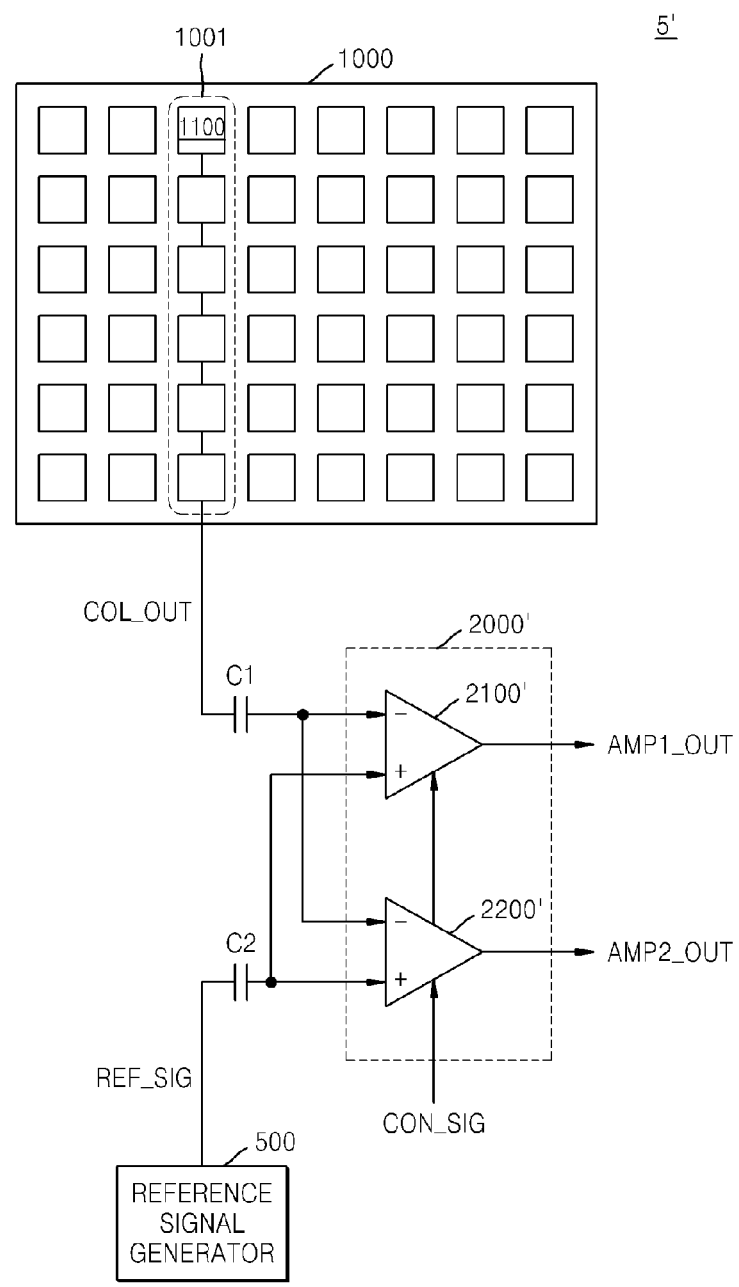
FIG. 4 is a schematic view illustrating an embodiment of an image sensor, according to aspects of the inventive concept.
Figure 5:
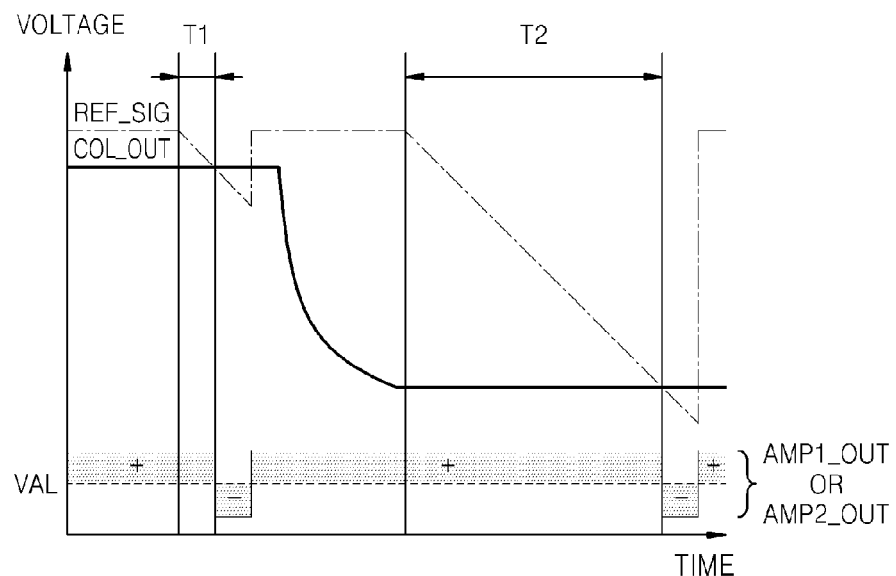
FIG. 5 is a view illustrating an embodiment of an operation of the image sensor, according to aspects of the inventive concept.

FIG. 4 is a view schematically illustrating an embodiment of an image sensor 5' according to an aspect of the inventive concept. FIG. 5 is a view illustrating an embodiment of an operation of the image sensor 5' according to an aspect of the inventive concept. As illustrated in FIG. 4, the image sensor 5' may include a pixel array 1000 and an amplifier circuit 2000'. Since the pixel array 1000 can be the same as that described with reference to FIG. 1, description thereof will not be given here.

According to this embodiment, the amplifier circuit 2000' may include a first amplifier 2100' and a second amplifier 2200'. As illustrated in FIG. 4, according to the current embodiment, the first amplifier 2100' and the second amplifier 2200' may be differential amplifiers, each having two input signals. In addition, the image sensor 5' may include a reference signal generator 500 configured to generate a reference signal REF_SIG. The reference signal REF_SIG generated by the reference signal generator 500 may be input to each of the first and second amplifiers 2100' and 2200' together with the output signal COL_OUT output by the pixel array 1000. As illustrated in FIG. 4, the output signal COL_OUT and the reference signal REF_SIG may respectively pass through capacitors C1 and C2 and are both input to each of the first and second amplifiers 2100' and 2200'.

The first amplifier 2100' may have a first input dynamic range and the second amplifier 2200' may have a second input dynamic range that is larger than the first input dynamic range. According to this embodiment, as illustrated in the example of FIG. 4, when the first and second amplifiers 2100' and 2200' are differential amplifiers, the first amplifier 2100' may have a first input common-mode range and the second amplifier 2200' may have a second input common-mode range that is larger than the first input common-mode range. An input common-mode range refers to a voltage range of input signals that the differential amplifier (for example, the first or second amplifier 2100' or 2200') may normally amplify. In the differential amplifier, the input dynamic range may be represented as the input common-mode range.

As described above, the ADC may be used for converting the output signal COL_OUT output from the pixel array 1000 into digital data. Various kinds of ADCs are well known in the art, and may be used. According to the embodiment of the inventive concept, the image sensor 5' may include a ramp-comparative ADC, as an example. The ramp-comparative ADC may generate a reference signal and may measure a length of duration of the signal which is generated by comparing an analog signal with the reference signal.

As illustrated in the embodiment of FIG. 5, the reference signal generator 500 may generate the reference signal REF_SIG, of which a voltage is reduced with a uniform slope. The first and second amplifiers 2100' and 2200' that are the differential amplifiers may generate output signals (that is, first and second amplified signals AMP1_OUT and AMP2_OUT) that change at points in time when the reference signal REF_SIG and the output signal COL_OUT intersect. The image sensor 5' may include a counter, and the counter may count the first and second amplified signals AMP1_OUT and AMP2_OUT generated by the first and second amplifiers 2100' and 2200' to measure a magnitude of the output signal COL_OUT.

As described with reference to the embodiment of FIG. 2, the amplifier circuit 2000' may receive in advance the output signal COL_OUT corresponding to the reset voltage of the floating diffusion node 1112 through CDS. As illustrated in FIG. 5, the reference signal generator 500 may generate the reference signal REF_SIG of which a voltage is reduced with the uniform slope at a starting point of a period T1. As the voltage of the reference signal REF_SIG is reduced with the uniform slope, the reference signal REF_SIG intersects the output signal COL_OUT at an end point of the period T1. In other words, REF_SIG and COL_OUT have the same magnitude where they intersect at the end of period T1. Therefore, the first or second amplifier 2100' or 2200' that is a differential amplifier may be configured and arranged to output the first or second amplified signal AMP1_OUT or AMP2_OUT, of which a voltage is reduced to be lower than a threshold value VAL at the end point of the period T1. The counter may measure a time from the starting point of the period T1 at which the voltage of the reference signal REF_SIG generated by the reference signal generator 500 starts to be reduced to the end point of the period T1 at which the voltage of the first or second amplified signal AMP1_OUT or AMP2_OUT is reduced to be lower than the threshold value VAL to measure the voltage of the output signal COL_OUT.

After the amplifier circuit 2000' amplifies the output signal COL_OUT corresponding to the reset voltage of the floating diffusion node 1112, the amplifier circuit 2000' may receive the output signal COL_OUT corresponding to the voltage generated by the photo detecting device 1111. As illustrated in FIG. 5, as with measuring the output signal COL_OUT corresponding to the reset voltage of the floating diffusion node 1112, the reference signal generator 500 may generate the reference signal REF_SIG of which a voltage is reduced with a uniform slope from a starting point of a period T2. As the voltage of the reference signal REF_SIG is reduced with the uniform slope, the reference signal REF_SIG intersects the output signal COL_OUT at an end point of the period T2. In other words, REF_SIG and COL_OUT have the same magnitude where they intersect at the end of period T2. Therefore, the first or second amplifier 2100' or 2200' that is a differential amplifier may output the first or second amplified signal AMP1_OUT or AMP2_OUT of which a voltage is reduced to be lower than the threshold value VAL at the end point of the period T2. The counter may measure a time from the starting point of the period T2 at which the voltage of the reference signal REF_SIG generated by the reference signal generator 500 starts to be reduced to the end point of the period T2 at which the voltage of the first or second amplified signal AMP1_OUT or AMP2_OUT is reduced to be lower than the threshold value VAL to measure the voltage of the output signal COL_OUT. In accordance with CDS, the image sensor 5' may obtain a difference of a value obtained by the counter measuring the period T1 from a value obtained by the counter measuring the period T2 to measure the intensity of the light.

In various embodiments, according to aspects of the inventive concept, the reference signal generator 500 can generate the reference signal REF_SIG with a slope that varies in accordance with the intensity of the light in the period T2. That is, the reference signal generator 500 may generate the reference signal REF_SIG with a slope that varies in accordance with which one is selected between the first amplifier 2100' and the second amplifier 2200' in the period T2. For example, the reference signal generator 500 may receive the control signal CON_SIG. When the reference signal generator 500 receives the control signal CON_SIG corresponding to selection of the first amplifier 2100', the reference signal generator 500 may generate the reference signal REF_SIG with a lower slope (that is, a slope at which the voltage is more slowly reduced) than that in the period T1. In addition, when the reference signal generator 500 receives the control signal CON_SIG corresponding to selection of the second amplifier 2200', the reference signal generator 500 may generate the reference signal REF_SIG with a slope (that is, a slope at which the voltage is more rapidly reduced) that is higher than that used in the period T1.

According to the current embodiment, the output signal COL_OUT having a large value (or amount of change) in accordance with the intensity of the light with high intensity is amplified by the second amplifier 2200' together with the reference signal REF_SIG with the higher slope so that it is possible to prevent a width of the period T2 from significantly increasing. In addition, the output signal COL_OUT having a small value (or amount of change) in accordance with the intensity of the light with low intensity is amplified by the first amplifier 2100' together with the reference signal REF_SIG with the lower slope so that resolution of the intensity of the light with low intensity may be improved.

Figure 6:
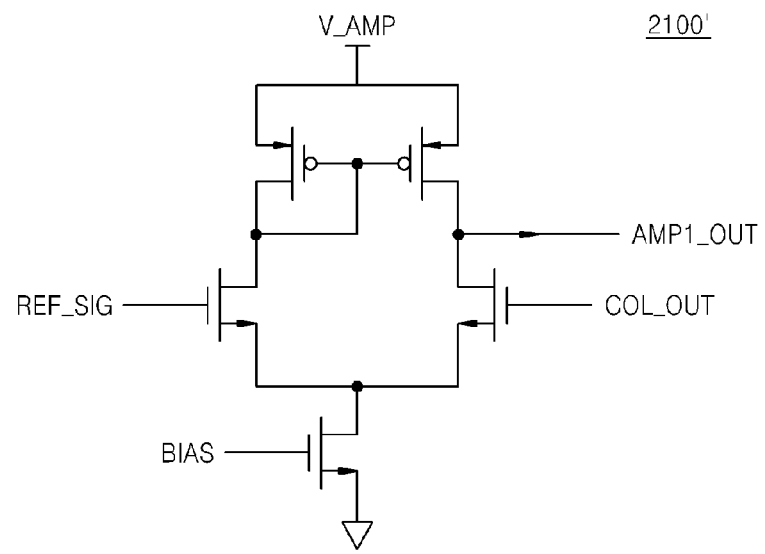
FIG. 6 is a circuit diagram of an embodiment of a first amplifier of FIG. 4, according to aspects of the inventive concept.

FIG. 6 is a circuit diagram of an embodiment of the first amplifier 2100' of FIG. 4 according to an aspect of the inventive concept. As illustrated in FIG. 6, the first amplifier 2100' may be a differential amplifier including three NMOS transistors and two PMOS transistors. A signal BIAS applied to a gate of the NMOS transistor to which a ground voltage is applied to a source thereof is maintained uniform so that the NMOS transistor may function as a current source. As described later, the signal BIAS may function as the control signal CON_SIG for stopping power consumption of the first amplifier 2100'. The two PMOS transistors to which a power supply voltage V_AMP is applied to sources thereof of the first amplifier 2100' may function as current mirrors. In addition, the two PMOS transistors may function as loads of the two NMOS transistors to which the reference signal REF_SIG and the output voltage COL_OUT are respectively applied to gates thereof. The differential amplifier illustrated in FIG. 6 has a simple structure and may obtain a large gain.

Additionally, in the first amplifier 2100' illustrated in FIG. 6, a range of an input voltage may be limited by the NMOS transistors and the PMOS transistors that operate in a saturation region. For example, as illustrated in FIG. 6, a minimum voltage of the reference signal REF_SIG may be obtained by adding a drain-source voltage when the NMOS transistor, a gate of which the voltage BIAS is applied, is in the saturation region and a gate-source voltage (higher than a threshold voltage) of the NMOS transistor, a gate of which the reference signal REF_SIG is applied, to the ground voltage. Referring to FIG. 3, since the voltage of the output signal COL_OUT may be reduced as the intensity of the light increases, the first amplifier 2100' may not normally amplify the output signal COL_OUT corresponding to the light with high intensity. As described later, the output signal COL_OUT corresponding to the light with high intensity may be amplified by the second amplifier 2200'.

Referring to FIG. 4, in order to turn on or off the first amplifier 2100', the control signal CON_SIG may be provided. According to the embodiment illustrated in FIG. 6, the control signal CON_SIG may include a signal that may block the power supply voltage V_AMP of the first amplifier 2100' and the signal BIAS applied to the gate of the NMOS transistor that functions as the current source. For example, when a voltage of the signal BIAS becomes the ground voltage, a current path from the power supply voltage V_AMP of the first amplifier 2100' to ground potential may be blocked so that the power consumption of the first amplifier 2100' may be stopped (that is, the first amplifier 2100' may be turned off).

Figure 7A:
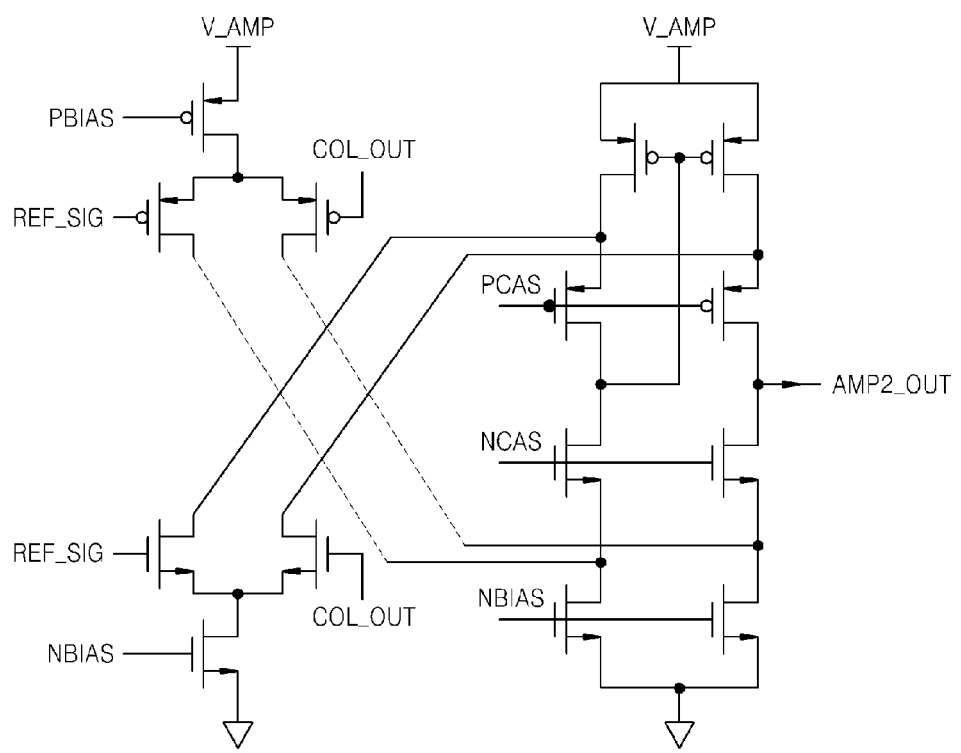
FIGS. 7A and 7B are circuit diagrams of embodiments of a second amplifier of FIG. 4, according to aspects of the inventive concept.
Figure 7B:
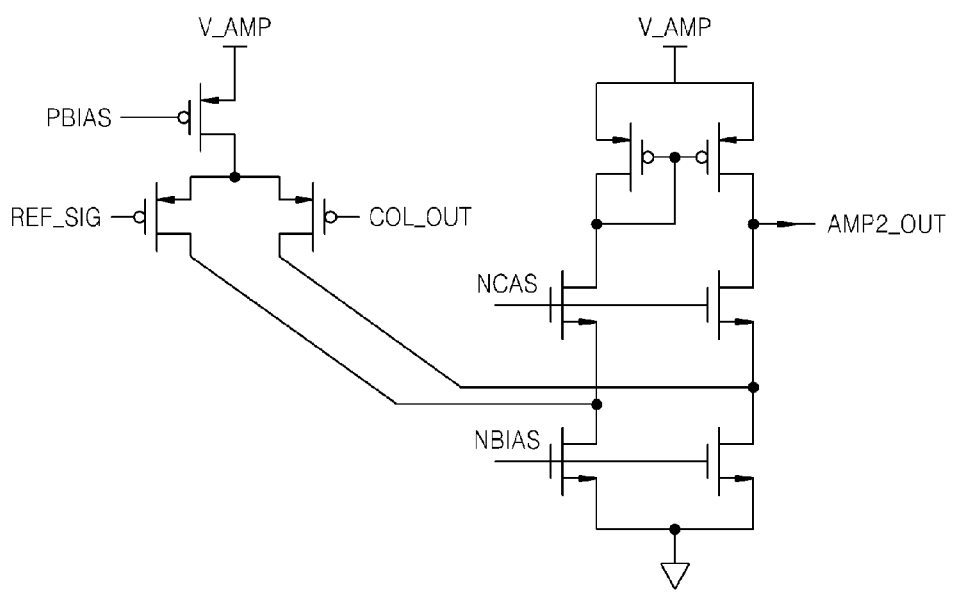

FIGS. 7A and 7B are circuit diagrams illustrating different embodiments of the second amplifier 2200' of FIG. 4 according to aspects of the inventive concept. The embodiments illustrated in FIGS. 7A and 7B are amplifiers having large input common-mode ranges, which may be referred to as PMOS/NMOS input folded cascade amplifiers. According to this embodiment, the second amplifier 2200' illustrated in FIGS. 7A and 7B may consume more power than, for example, the first amplifier 2100' illustrated in FIG. 6. Therefore, as illustrated in FIG. 4, the control signal CON_SIG for turning off the first amplifier 2100' or the second amplifier 2200' may be provided in accordance with the intensity of the light.

As illustrated in the embodiment of FIG. 7A, a second amplifier 2200'a may include seven NMOS transistors and seven PMOS transistors. The reference signal REF_SIG and the output signal COL_OUT that are input signals of the second amplifier 2200'a may each be applied to each gate of a pair of NMOS transistors and each gate of a pair of PMOS transistors. Since the reference signal REF_SIG and the output signal COL_OUT are applied to the gates of the pair of NMOS transistors (that is, due to a folded structure of the pair of NMOS transistors), an input common-mode range of the second amplifier 2200'a may extend in a direction of a power supply voltage V_AMP of the second amplifier 2200'a. In addition, since the reference signal REF_SIG and the output signal COL_OUT are applied to the gates of the pair of PMOS transistors (that is, due to a folded structure of the pair of PMOS transistors), the input common-mode range of the second amplifier 2200'a may extend in a direction of a ground voltage.

Referring to FIG. 4, the control signal CON_SIG may be provided in order to turn on or off the second amplifier 2200'a. According to the embodiment illustrated in FIG. 7A, the control signal CON_SIG may include a signal that blocks the power supply voltage VAMP of the second amplifier 2200'a and a signal NBIAS that functions as a current source and that is applied to gates of the NMOS transistors to which the ground voltage are applied to sources thereof. For example, when the voltage of the signal BIAS becomes the ground voltage, a current path from the power supply voltage V_AMP of the second amplifier 2200'a to a ground potential may be blocked so that power consumption of the second amplifier 2200'a may be stopped (that is, the second amplifier 2200'a may be turned off). The control signal CON_SIG may include a signal PBIAS that functions as a current source and that is applied to a gate of the PMOS transistor to which the power supply voltage V_AMP is applied to a source thereof. When a voltage of the signal PBIAS becomes the power supply voltage V_AMP, the second amplifier 2200'a may be turned off.

On the other hand, the control signal CON_SIG may include a signal PCAS or a signal NCAS. For example, when a voltage of the signal PCAS becomes the power supply voltage V_AMP, the PMOS transistors to which the signal PCAS is applied to gates thereof may be turned off so that the current path from the power supply voltage V_AMP of the second amplifier 2200'a to the ground potential may be blocked. In addition, when a voltage of the signal NCAS becomes the ground voltage, the NMOS transistors to which the signal NCAS is applied to gates thereof may be turned off so that the current path from the power supply voltage V_AMP of the second amplifier 2200'a to the ground potential may be blocked.

FIG. 7B is a circuit diagram of another embodiment of the second amplifier 2200' of FIG. 4 according to an aspect of the inventive concept. Referring to FIG. 3, when the output signal COL_OUT generated by the unit pixels 1100 of the pixel array 1000 is a signal having a voltage that is reduced as the intensity of the light increases, the input common-mode range of the second amplifier 2200' of FIG. 4 may extend in the direction of the ground voltage. Therefore, as illustrated in FIG. 7B, a second amplifier 2200'b may have a simpler structure than that of the second amplifier 2200'a embodiment illustrated in FIG. 7A.

As illustrated in the embodiment of FIG. 7B, the second amplifier 2200'b may include four NMOS transistors and five PMOS transistors. The reference signal REF_SIG and the output signal COL_OUT that are input signals of the second amplifier 2200'b may be applied to gates of a pair of PMOS transistors. Since the reference signal REF_SIG and the output signal COL_OUT are applied to the gates of the pair of PMOS transistors (that is, due to a folded structure of the pair of PMOS transistors), an input common-mode range of the second amplifier 2200'b may extend in a direction of a ground voltage.

Referring to FIG. 4, the control signal CON_SIG provided to turn on or off the second amplifier 2200'b may include the signal PBIAS, the signal NBIAS, or the signal NCAS illustrated in FIG. 7B. As described above with reference to FIG. 7A, the voltage of the signal PBIAS becomes the power supply voltage V_AMP or a voltage of the signal NCAS or the signal NBIAS becomes the ground voltage so that power consumption of the second amplifier 2200'b may be stopped (that is, the second amplifier 2200'b may be turned off).

Figure 8A:
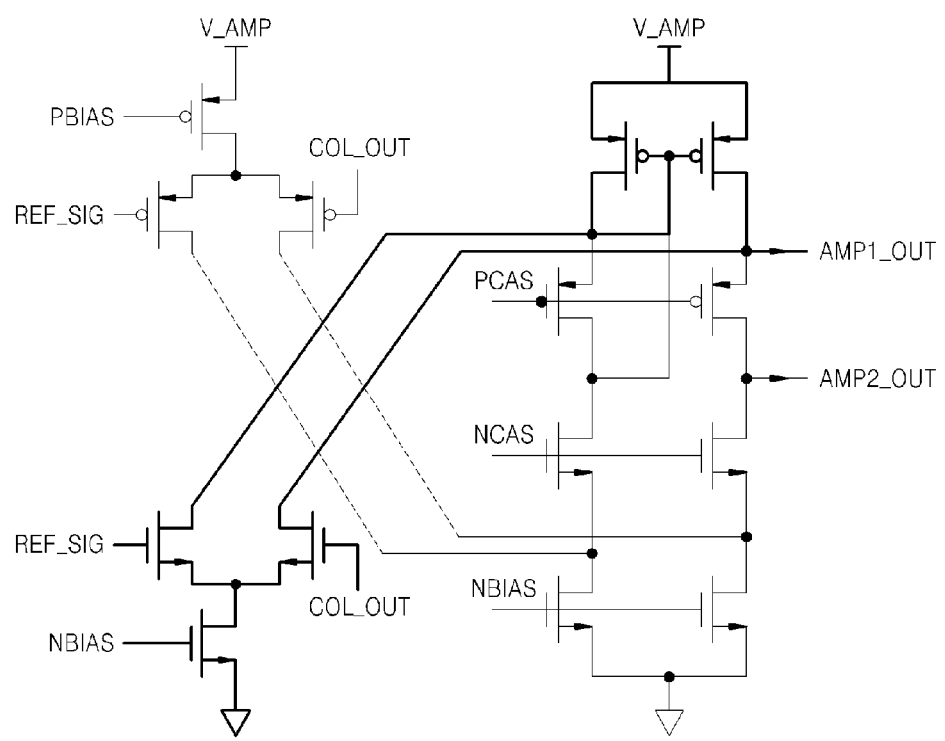
FIGS. 8A and 8B are circuit diagrams of embodiments of an amplifier circuit of FIG. 4, according to aspects of the inventive concept.
Figure 8B:
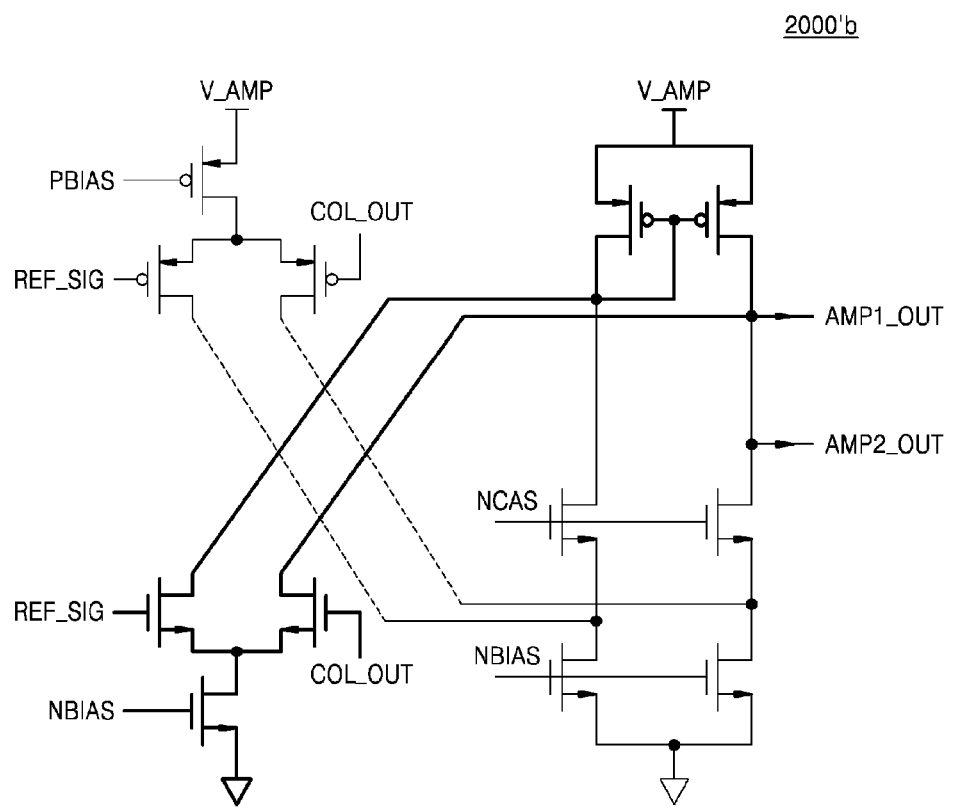

FIGS. 8A and 8B are circuit diagrams of other embodiments of the amplifier circuit 2000' of FIG. 4, according to aspects of the inventive concept. Amplifier circuits 2000'a and 2000'b illustrated in FIGS. 8A and 8B may have structures in which the first amplifier 2100' and the second amplifier 2200' of FIG. 4 are combined according to embodiments of the inventive concept. In FIGS. 8A and 8B, the circuits marked with thick lines may perform an operation corresponding to that of the first amplifier 2100' of FIG. 4 and the circuits marked with thin lines may perform an operation corresponding to that of the second amplifier 2200' of FIG. 4. The control signal CON_SIG may be used to determine which operation the amplifier circuits 2000'a and 2000'b perform between the operations corresponding to those of the first amplifier 2100' and the second amplifier 2200' of FIG. 4. According to the embodiments illustrated in FIGS. 8A and 8B, the control signal CON_SIG of FIG. 4 may include at least one of the signals applied to the gates of the PMOS transistors or the NMOS transistors. The control signal CON_SIG will be described in detail later.

As illustrated in the embodiment of FIG. 8A, the amplifier circuit 2000'a may include seven NMOS transistors and seven PMOS transistors. The reference signal REF_SIG and the output signal COL_OUT may be applied to each of gates of a pair of NMOS transistors and gates of a pair of PMOS transistors. When the light with low intensity is incident on the pixel array 1000 so that the amplifier circuit 2000'a performs the operation corresponding to that of the first amplifier 2100' of FIG. 4, the circuit marked with the thin line in FIG. 8A may not operate, or may be turned off. That is, the amplifier circuit 2000'a may amplify the reference signal REF_SIG and the output signal COL_OUT to output the first amplified signal AMP1_OUT. For example, the control signal CON_SIG may include the signal PCAS and the power supply voltage V_AMP is applied to the signal PCAS so that the amplifier circuit 2000'a may perform the operation corresponding to that of the first amplifier 2100' of FIG. 4. The control signal CON_SIG may include the signal NCAS or the signal NBIAS and the ground voltage may be applied as the signal NCAS or the signal NBIAS so that the amplifier circuit 2000'a may perform the operation corresponding to that of the first amplifier 2100' of FIG. 4.

On the other hand, when the light with high intensity is incident on the pixel array 1000 so that the amplifier circuit 2000'a performs the operation corresponding to that of the second amplifier 2200' of FIG. 4, the circuit marked with the thick line in FIG. 8A may not operate, or may be turned off. That is, the amplifier circuit 2000'a may amplify the reference signal REF_SIG and the output signal COL_OUT to output the second amplified signal AMP2_OUT. For example, the control signal CON_SIG may include the signal NBIAS and the ground voltage may be applied as the signal NBIAS so that the amplifier circuit 2000'a may perform the operation corresponding to that of the second amplifier 2200' of FIG. 4.

FIG. 8B is a circuit diagram of an embodiment of the amplifier circuit 2000' of FIG. 4, according to an aspect of the inventive concept. As illustrated in the embodiment of FIG. 8B, the amplifier circuit 2000'b may include seven NMOS transistors and five PMOS transistors. The reference signal REF_SIG and the output signal COL_OUT may be applied to each of gates of a pair of NMOS transistors and gates of a pair of PMOS transistors. When the light with low intensity is incident on the pixel array 1000 so that the amplifier circuit 2000'b performs the operation corresponding to that of the first amplifier 2100' of FIG. 4, the circuit marked with the thin line in FIG. 8B may not operate, or may be turned off. That is, the amplifier circuit 2000'b may amplify the reference signal REF_SIG and the output signal COL_OUT to output the first amplified signal AMP1_OUT. For example, the control signal CON_SIG may include the signal NCAS or the signal NBIAS and the ground voltage may be applied as the signal NCAS or the signal NBIAS so that the amplifier circuit 2000'b may perform the operation corresponding to that of the first amplifier 2100' of FIG. 4.

On the other hand, when the light with high intensity is incident on the pixel array 1000 so that the amplifier circuit 2000'b performs the operation corresponding to that of the second amplifier 2200' of FIG. 4, the circuit marked with the thick line in FIG. 8B may not operate, or may be turned off. That is, the amplifier circuit 2000'b may amplify the reference signal REF_SIG and the output signal COL_OUT to output the second amplified signal AMP2_OUT. For example, the control signal CON_SIG may include the signal NBIAS and the ground voltage may be applied as the signal NBIAS so that the amplifier circuit 2000'b may perform the operation corresponding to that of the second amplifier 2200' of FIG. 4.

FIG. 9 is a view illustrating an embodiment of a structure of the image sensor 5' according to an aspect of the inventive concept. The image sensor 5' may be manufactured by semiconductor processes, for example. With the development of semiconductor process technology, a feature size that refers to a minimum channel length of a transistor is reduced using such processes. With the reduction in the feature size of the semiconductor processes, a lower power supply voltage is supplied so that power consumption of a semiconductor device may be reduced and more semiconductor devices may be integrated. However, since the unit pixels 1100 included in the pixel array 1000 of the image sensor 5' include the photo detecting device 1111 that absorbs light, there may be limitations in reducing a size of the unit pixel 1100, such that a pixel array may not lend itself to the same reduction in size or power reduction as other types of circuits.

As illustrated in the embodiment of FIG. 9, the pixel array 1000 including the unit pixels 1100 may be implemented in a first chip 10 having a large feature size and other circuits, such as the amplifier circuit 2000', a reference signal generator 5000, and a counter 700, may be implemented in a second chip 20 having a small feature size. The amplifier circuit 2000' may include the first amplifier 2100' and the second amplifier 2200'. The counter 700 may count the signals output by the amplifier circuit 2000'. The amplifier circuit 2000' and the counter 700 may function as an ADC for outputting a digital signal based on the output signal COL_OUT and the reference signal REF_SIG that are analog signals.

As illustrated in the embodiment of FIG. 9, the first chip 10 and the second chip 20 may be stacked, one above the other. In this embodiment, the first chip having the pixel array is stacked on the second chip having the amplifier circuit. As described above, the image sensor 5', in which two or more chips are stacked, may be referred to as a stacked image sensor. The image sensor 5' may include interconnecting members 30 in order to transmit the output signals COL_OUT output by the pixel array 1000 of the first chip 10 to the amplifier circuit 2000' of the second chip 20. The interconnecting member 30 may be formed of a conductive material and may include, for example, a through silicon via (TSV), a back via stack (BVS), and a copper-to-copper (C2C).

As illustrated in the embodiment of FIG. 9, the first chip 10 may include one or more pads 11 in order to electrically connect the interconnecting members 30 and the pixel array 1000. In addition, the second chip 20 may include one or more pads 21 in order to electrically connect the interconnecting members 30 and the amplifier circuit 2000'. A size (for example, about 4.5 µm×2.0 µm) of the pad 11 or 21 may be larger than that (for example, about 1 µm×1 µm) of a unit pixel 1100. When the number of electrical signals transmitted between the first chip 10 and the second chip 20 increases, the number of interconnecting members 30 increases so that the number of pads 11 or 21 may increase. Increase in the number of pads 11 or 21 may increase a size of the image sensor 5'.

A power supply voltage (for example, 2.8V) supplied to the first chip 10 may be higher than that (for example, 1.8V) supplied to the second chip 20. As described with reference to FIG. 2, the pixel voltage V_PIX supplied to the unit pixels 1100 included in the pixel array 1000 of the first chip 10 may be high enough to reset the floating diffusion node 1112. On the other hand, a power supply voltage (for example, the power supply voltage V_AMP in FIGS. 6 to 8B) that is lower than that supplied to the first chip 10 may be supplied to the amplifier circuit 2000' included in the second chip 20 in order to reduce power consumption. Therefore, the amplifier circuit 2000' normally amplifying the output signal COL_OUT generated by the unit pixels 1100 may be required, wherein a lower power supply voltage is supplied to the amplifier circuit 2000', and a higher voltage is supplied to unit pixels 1100.

For example, when the output signals COL_OUT output by the pixel array 1000 are attenuated by the first chip 10, a signal to noise ratio (SNR) of the output signal COL_OUT corresponding to the light with low intensity may deteriorate. In another example, when the output signals COL_OUT are selectively attenuated in accordance with the intensity of the light incident on the pixel array 1000, in order to prevent the second chip 20 from being damaged due to a difference in power supply voltage between the first chip 10 and the second chip 20, a switching transistor for selectively attenuating the output signals COL_OUT may be arranged in the first chip 10. In the current example, two interconnecting members 30 (that is, a signal that is not attenuated and an attenuated signal) may be required for one output signal COL_OUT so that the number of interconnecting members 30 and the number of pads 11 and 21 may increase.

As described above, according to various embodiments, since the amplifier circuit 2000' included in the second chip 20 may receive the output signals COL_OUT output by the pixel array 1000 directly, for instance without any attenuation, the amplifier circuit 2000' may amplify the directly received output signals COL_OUT. Therefore, it is possible to improve the SNR of the output signal COL_OUT and to prevent the size of the image sensor 5' from increasing. In addition, since the first amplifier 2100' and the second amplifier 2200' of the amplifier circuit 2000' are selectively turned on or off in accordance with the intensity of the light incident on the pixel array 1000, the power consumption of the image sensor 5' may be reduced.

When a pitch between the pads 11 is no more than two times that between the unit pixels 1100 in the first chip 10, the pads 11 may be arranged as illustrated in FIG. 9. That is, two pads respectively corresponding to two adjacent columns of the pixel array 1000 may be arranged on facing sides of the first chip 10.

On the other hand, according to the embodiment of the inventive concept, the first amplifier 2100' and the second amplifier 2200' of the amplifier circuit 2000' may be arranged in the first chip 10. That is, unlike in the embodiment illustrated in FIG. 9, the amplifier circuit 2000' and the pixel array 1000 may be arranged in the first chip 10. In this case, in the first chip 10, the amplifier circuit 2000' and the pixel array 1000 may be separately arranged to receive different power supply voltages from the first chip 10. At this time, the signal output by the first amplifier 2100' or the second amplifier 2200' may be transmitted from the first chip 10 to the second chip 20 through the interconnecting members 30.

Figure 10:
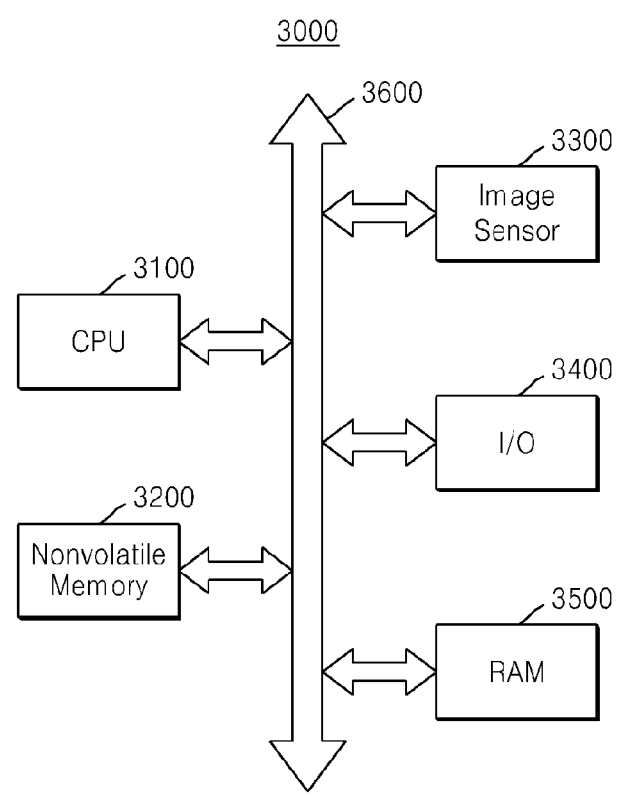
FIG. 10 is a view illustrating an embodiment of a system including an image sensor, according to aspects of the inventive concept.

FIG. 10 is a view illustrating an embodiment of a system 3000 including an embodiment of an image sensor according to aspects of the inventive concept. The system 3000 may be one of a computing system, a camera system, a scanner, a vehicle navigator, a video phone, a security system, and a movement detecting system, or the like that require image data.

As illustrated in the embodiment of FIG. 10, the system 3000 may include a central processing unit (or processor) (CPU) 3100, a non-volatile memory 3200, an image sensor 3300, an input and output apparatus 3400, and random access memory (RAM) 3500. The CPU 3100 may communicate with the non-volatile memory 3200, the image sensor 3300, the input and output apparatus 3400, and the RAM 3500 through a bus 3600. The image sensor 3300 may be implemented on an independent semiconductor chip and may be implemented by one semiconductor chip in combination with the CPU 3100. Referring to FIG. 1, the image sensor 3300 included in the system 3000 illustrated in FIG. 10 may include the pixel array 1000 and the amplifier circuit 2000 including the first and second amplifiers 2100 and 2200, which are described above according to various embodiments falling within the scope of the inventive concept. The first amplifier 2100 may have a larger gain than that of the second amplifier 2200 and the second input common-mode range of the second amplifier 2200 may be larger than the first input common-mode range of the first amplifier 2100. The image sensor 3300 may select one of the first amplifier 2100 and the second amplifier 2200 in accordance with the intensity of the light by using the control signal CON_SIG and may measure the output signals COL_OUT received from the pixel array 1000 through the output signal of the selected amplifier.

The CPU 3100 may control the system 3000 and may transmit data to or receive data from other elements through the bus 3600. For example, the CPU 3100 may receive data generated by the image sensor 3300 according to the embodiment of the inventive concept. The non-volatile memory 3200 that maintains stored data although power is blocked may store, for example, data generated by the image sensor 3300 or data obtained by processing the generated data. The RAM 3500 may function as a data memory of the CPU 3100 and may be a non-volatile memory. The input and output apparatus 3400 may receive a command from a user of the system 3000 or may output an image and/or voice to the user.

Figure 11:
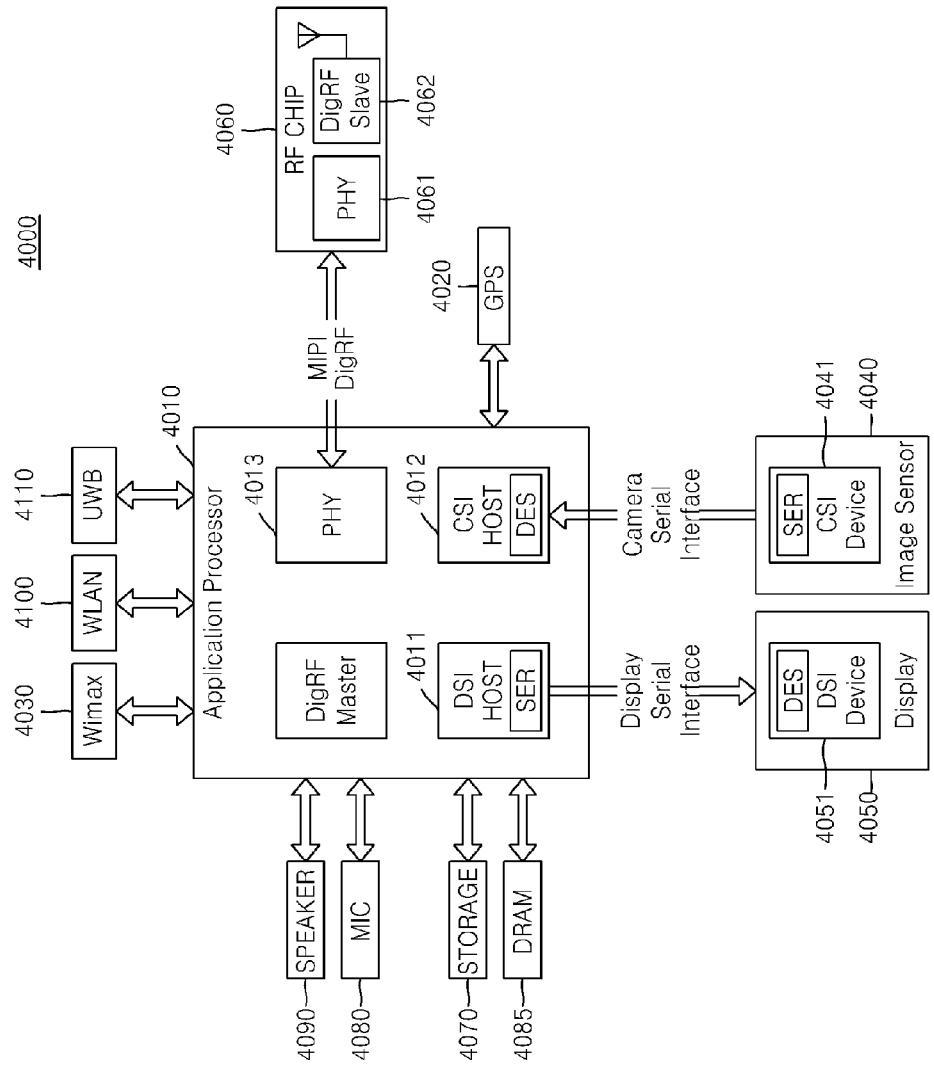
FIG. 11 is a view illustrating an embodiment of an electronic system including an image sensor and interfaces, according to aspects of the inventive concept.

FIG. 11 is a view illustrating an embodiment of an electronic system 4000 including an image sensor 4040 and interfaces, according to aspects of the inventive concept. Referring to the embodiment of FIG. 11, the electronic system 4000 may be implemented by a digital camera or a data processing apparatus capable of using or supporting a mobile industry processor interface (MIPI) that may include a digital camera, for example, a mobile phone, a personal digital assistant (PDA), a portable media player (PMP), tablet, phablet, or a smartphone. The electronic system 4000 may include, but is not limited to, an application processor 4010, the image sensor 4040, and a display 4050.

Referring to FIG. 1, the image sensor 4040 illustrated in FIG. 11 may include the pixel array 1000 and the amplifier circuit 2000 including the first and second amplifiers 2100 and 2200, which are described above according to the embodiments of the inventive concept. The image sensor 4040 may select one of the first amplifier 2100 and the second amplifier 2200 in accordance with the intensity of the light by using the control signal CON_SIG and may measure the output signals COL_OUT received from the pixel array 1000 through the output signal of the selected amplifier.

A camera serial interface (CSI) host 4012 implemented in the application processor 4010 may serially communicate with a CSI apparatus 4041 of the image sensor 4040 through a CSI. At this time, for example, an optical deserializer may be implemented in the CSI host 4012 and an optical serializer may be implemented in the CSI apparatus 4041.

A display serial interface (DSI) host 4011 implemented in the application processor 4010 may serially communicate with a DSI apparatus 4051 of the display 4050 through a DSI. At this time, for example, an optical serializer may be implemented in the DSI host 4011 and an optical deserializer may be implemented in the DSI apparatus 4051.

The electronic system 4000 may further include a radio frequency (RF) chip 4060 capable of communicating with the application processor 4010. A PHY chip 4013, which is a physical layer communication chip, of the electronic system 4000 and a PHY chip 4061 of the RF chip 4060 may transmit or receive data in accordance with MIPI DigRF specifications.

The electronic system 4000 may further include, but is not limited to, a global positioning system (GPS) 4020, a storage unit 4070, dynamic RAM (DRAM) 4085, a speaker 4090, and a microphone 4080. The electronic system 4000 may perform communication by using a Wimax 4030, a wireless local area network (WLAN) 4100, and/or an ultra-wideband (UWB) 4110.

While embodiments in accordance with the inventive concept have been particularly shown and described with reference to exemplary drawings thereof, it will be understood that various changes in form and details may be made therein without departing from the spirit and scope of the following claims, which cover that shown and described with respect to the figures, as well as physical and/or functional equivalents thereof.

What is claimed is:

1. An image sensor comprising:
   a pixel array comprising a plurality of unit pixels configured to generate an output signal in response to incident light;
   a first amplifier having a first input dynamic range; and
   a second amplifier having a second input dynamic range that is larger than the first input dynamic range,
   wherein one of the first and second amplifiers amplifies the output signal in accordance with the intensity of light,
   wherein the first and second amplifiers are configured to receive a control signal, and
   wherein a power consumption of the first amplifier or the second amplifier is stopped depending on a voltage level of the control signal.

2. The image sensor of claim 1, further comprising:
   a reference signal generator configured to generate a reference signal,
   wherein the first and second amplifiers are differential amplifiers configured to each receive the reference signal and the output signal as inputs and to measure the output signal relative to the reference signal.

3. The image sensor of claim 2, wherein the second amplifier is a complementary metal-oxide-semiconductor (CMOS) input folded cascade amplifier.

4. The image sensor of claim 1, wherein:
   the image sensor comprises stacked first and second chips,
   the pixel array is arranged in the first chip, and
   the first and second amplifiers are arranged in the second chip.

5. The image sensor of claim 4, wherein a feature size of the first chip is larger than that of the second chip.

6. The image sensor of claim 4, wherein a power supply voltage of the first chip is higher than that of the second chip.

7. The image sensor of claim 4, further comprising:
   at least one interconnecting member coupled between the first chip and the second chip to transfer the output signal between the first and second chips,
   wherein the interconnecting member is electrically connected to unit pixels corresponding to a column of the pixel array.

8. The image sensor of claim 4, further comprising:
   a counter configured to convert a signal amplified by the first or second amplifier into a digital signal,
   wherein the counter is arranged in the second chip.

9. An image sensor comprising:
   a first chip including a pixel array comprising a plurality of unit pixels configured to generate an output signal in accordance with incident light;
   a second chip including first and second amplifiers with different input dynamic ranges, such that one of the first and second amplifiers amplifies the output signal depending on the intensity of the incident light; and
   an interconnecting member arranged to transmit the output signal from the first chip to the second chip,
   wherein the first and second chips are stacked,
   wherein an input dynamic range of the second amplifier is larger than that of the first amplifier, and
   wherein a gain of the first amplifier is larger than that of the second amplifier.

10. The image sensor of claim 9, wherein:
    a feature size of the first chip is larger than that of the second chip, and
    a power supply voltage of the first chip is higher than that of the second chip.

11. The image sensor of claim 9, wherein:
    the second chip further comprises a reference signal generator configured to generate a reference signal used to measure the output signal, and
    the first and second amplifiers are differential amplifiers that receive the reference signal and the output signal as inputs.

12. The image sensor of claim 9, wherein:
    the first and second amplifiers receive a control signal, and
    power consumption of one of the first and second amplifiers is stopped in accordance with the control signal.

13. The image sensor of claim 9, wherein the interconnecting member is electrically connected to unit pixels corresponding to a column of the pixel may.

14. An image sensor, comprising:
    a pixel array comprising a plurality of unit pixels configured to generate a plurality of output signals in response to incident light; and
    a plurality of amplifier circuits configured to receive the plurality of output signals, each amplifier circuit comprising:
       a first amplifier having a first input dynamic range and configured to amplify the output signal when the incident light has a low intensity; and
       a second amplifier having a second input dynamic range that is larger than the first input dynamic range, and configured to amplify the output signal when the incident light has a high intensity,
       wherein the pixel array is formed on a first chip; and
       wherein the plurality of amplifiers is formed on at least one second chip.

15. The image sensor of claim 14, wherein the first amplifier has a larger gain than the second amplifier.

16. The image sensor of claim 14, wherein:
    the first and second amplifiers are configured to receive a control signal, and
    a power consumption of the first amplifier or the second amplifier is stopped depending on a voltage level of the control signal.

17. The image sensor of claim 14, further comprising:
    an interconnecting member arranged to transmit the output signal from the first chip to the at least one second chip,
    wherein the first chip and the at least one second chip are stacked.

* * * * *